(12) United States Patent
Kishi et al.

(10) Patent No.: US 6,410,843 B1
(45) Date of Patent: Jun. 25, 2002

(54) SOLAR CELL MODULE

(75) Inventors: Hitoshi Kishi, Neyagawa; Kenji Uchihashi, Amagasaki; Seiichi Kiyama, Takatsuki, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/716,438

(22) Filed: Nov. 21, 2000

(30) Foreign Application Priority Data

Nov. 22, 1999 (JP) ............................................. 11-332057

(51) Int. Cl.[7] ............................................. H01L 31/052
(52) U.S. Cl. ........................ 136/246; 136/244; 136/251; 136/256; 136/259; 136/258
(58) Field of Search ................................ 136/246, 244, 136/251, 256, 259, 258

(56) References Cited

U.S. PATENT DOCUMENTS

| | | | | |
|---|---|---|---|---|
| 4,153,476 A | * | 5/1979 | Shelpuk | 136/246 |
| 4,418,238 A | * | 11/1983 | Lidorenko et al. | 136/246 |
| 4,663,495 A | * | 5/1987 | Berman et al. | 138/248 |
| 5,994,641 A | * | 11/1999 | Kardauskas | 136/246 |
| 6,215,606 B1 | * | 4/2001 | Morizane et al. | 136/251 |
| 2001/0011552 A1 | * | 8/2001 | Morizane et al. | 136/251 |
| 2001/0020486 A1 | * | 9/2001 | Tsuge | 135/251 |

FOREIGN PATENT DOCUMENTS

JP  2001-148500 A  *  5/2001

* cited by examiner

*Primary Examiner*—Alan Diamond
(74) *Attorney, Agent, or Firm*—Arent Fox Kintner Plotkin & Kahn

(57) ABSTRACT

A solar cell module according to this invention comprises a front surface member which is transparent, a rear surface member, a plurality of two-side incidence type solar cells sealed between the front surface member and the rear surface member, a connecting member which is conductive for electrically connecting the solar cells in series or in parallel, and a reflecting surface for reflecting light incident from the front surface member to a space between the solar cells which are adjacent each other and for introducing reflected light to a rear surface of the solar cell.

8 Claims, 6 Drawing Sheets

*Prior Art*

Fig.11

*Prior Art*

SOLAR CELL MODULE

BACKGROUND OF THE INVENTION

1. Field of the Invention

This invention relates to a solar cell module using a two-side incidence type solar cell capable of generating power by utilizing light incident from both front and rear surfaces.

2. Description of Prior Art

Figure 10:
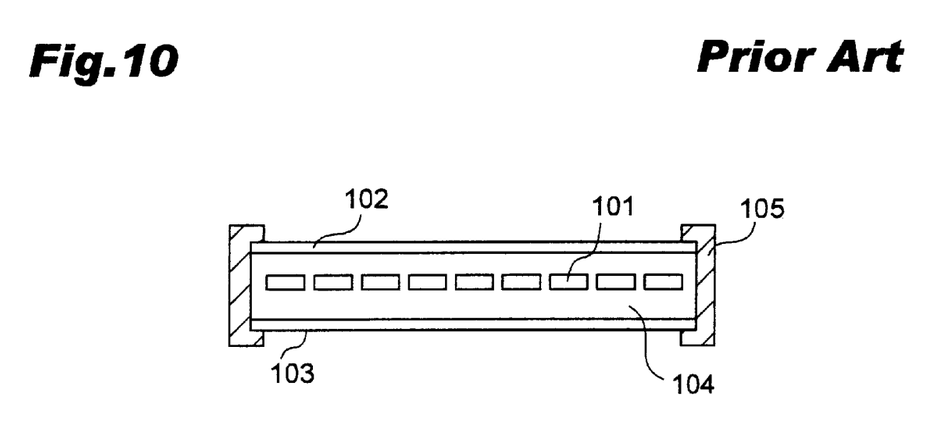
FIG. 10 is a schematic cross sectional view of a conventional solar cell module.

A conventional solar cell module comprises a plurality of solar cells 101 including a transparent front surface member 102, a rear surface member 103, and a transparent sealing material 104 sealed between the front surface member 102 and the rear surface member 103 as shown in a schematic cross sectional view of FIG. 10. Each of the solar cells 101 is electrically connected in series or in parallel each other with a conductive connecting member (not shown), and an output electricity is taken out from the module.

Glass is suitable for the front surface member 102. Particularly a reinforced glass having excellent light transmittivity and shock resistance is generally used. The rear surface member 103 comprises a metal film of aluminum or the like sandwiched between weather resistant resin films of PET (polyethylene terephthalate) or the like so as to be weather and moisture proof and electrically insulative. PVB (polyvinyl butyral) capable of suppressing degradation of light transmittivity caused by ultra violet rays and EVA (ethylene vinyl acetate) having excellent moisture proofness is mainly used as the sealing material 104.

A frame 105 of aluminum may be mounted around the module so as to improve the strength of the whole module.

Figure 11:
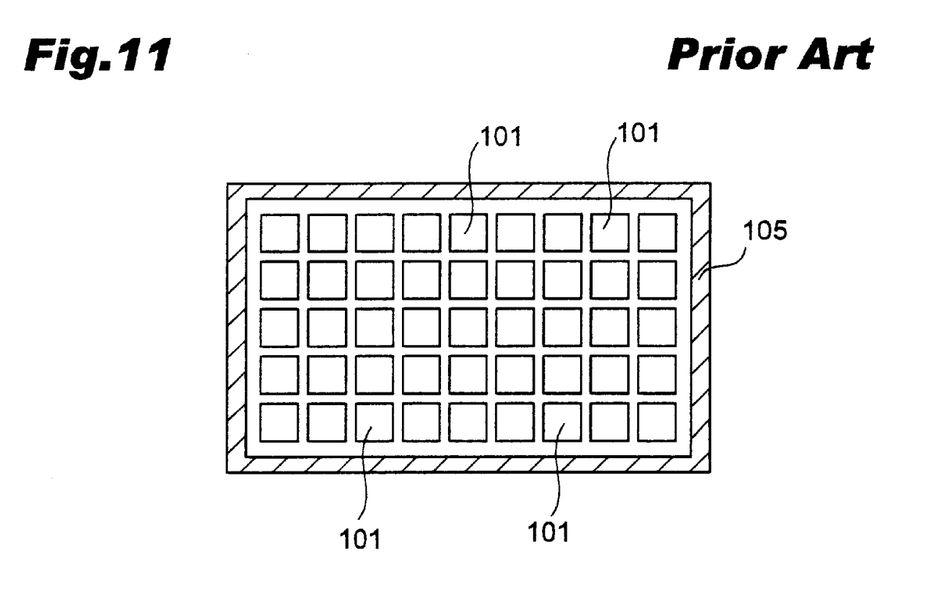
FIG. 11 is a schematic plan view of the conventional solar cell module.

It is preferred to increase an area ratio of the solar cells to the solar cell module in order to increase quantity of power generation in the conventional solar cell module. Thus, as shown in a schematic plan view of FIG. 11, solar cells having an approximately square shape are arrayed in matrix with little spaces of approximately 2–5 mm.

Meantime, it was found that power is generated not only by light incident from a front surface side of the solar cells but by light incident from a rear surface side of the solar cells, and the two-side incidence type solar cell capable of generating power by utilizing light incident from both of the front and rear surfaces has been developed.

A solar power generation system using the two-side incidence type solar cells is provided with solar cell modules -arranged on the ground or on a roof and comprising the two-side incidence type solar cells arrayed in matrix with little spaces to be close with each other. Scattered light which is incident to a lower side of the solar cell module and is irregularly reflected on the ground or a roof is incident to the rear surface side of the two-side incidence type solar cell.

SUMMARY OF THE INVENTION

In the above solar cell module, reflected light from a part shaded by a roof or from a ground is weak or less, and light is not incident from the shaded part to a rear surface of the two-side incidence type solar cell. Therefore, power generation efficiency per solar cell is not improved than expected, and reduction of cost by reducing the number of solar cells and reduction of weight of the solar cell module are not achieved.

This invention was made to provide a solar cell module having excellent output characteristics and manufactured at low cost without ineffectiveness as described above.

In order to solve the existing problems, the solar cell module according to this invention comprises a front surface member which is transparent, a rear surface member, a plurality of two-side incidence type solar cells arranged between the front surface member and the rear surface member, a connecting member which is conductive for electrically connecting the solar cells in series or in parallel, and a reflecting surface for reflecting light incident from the front surface member to a space between the solar cells which are adjacent each other and introducing reflected light to a rear surface of the solar cell.

In this solar cell module, incident light entered from a front surface member to a space between adjacent solar cells is reflected on the reflecting surface, and the reflected light reflected on the reflecting surface is introduced to the rear surface of the solar cell. Therefore, both of the incident light and the reflected light is incident to the solar cell, and power generation per solar cell increases as compared with the conventional solar all module of utilizing only incident light. Therefore, this invention can provide a solar cell module capable of reducing the number of solar cells necessary for obtaining same power generation as that in the existing solar cell module, having excellent output characteristics, and manufactured at low cost.

The reflecting surface is a scattering reflecting surface and is provided at least in a position corresponding to the space. Or, the reflecting surface is formed to be a recessed surface corresponding to the solar cell.

As described above, when the reflecting surface is the scattering reflecting surface, the incident light can be reflected slantly from the reflecting surface. Thus, the reflected light can be introduced to the rear surface of the solar cell effectively in spite of changes of an incident angle of the sunlight with time.

A ratio of areas of the solar cells to an area of the solar cell module is approximately 0.4–0.9. And, the solar cell has an approximately circle shape. With this structure, a solar cell module capable of generating greater power per module can be provided.

The reflecting surface is provided on a solar cell side of the rear surface member or on a rear surface side of the rear surface member.

BRIEF DESCRIPTION OF THE DRAWINGS

FIGS. 2A, 2B are schematic structural views of a solar cell module according to a first embodiment.

The foregoing and other objects, features, aspects and advantages of the present invention will become more apparent from the following detailed description of the present invention when collected conjunction with the accompanying drawings.

DESCRIPTION OF PREFERRED EMBODIMENT(S)

First Embodiment

Figure 1:
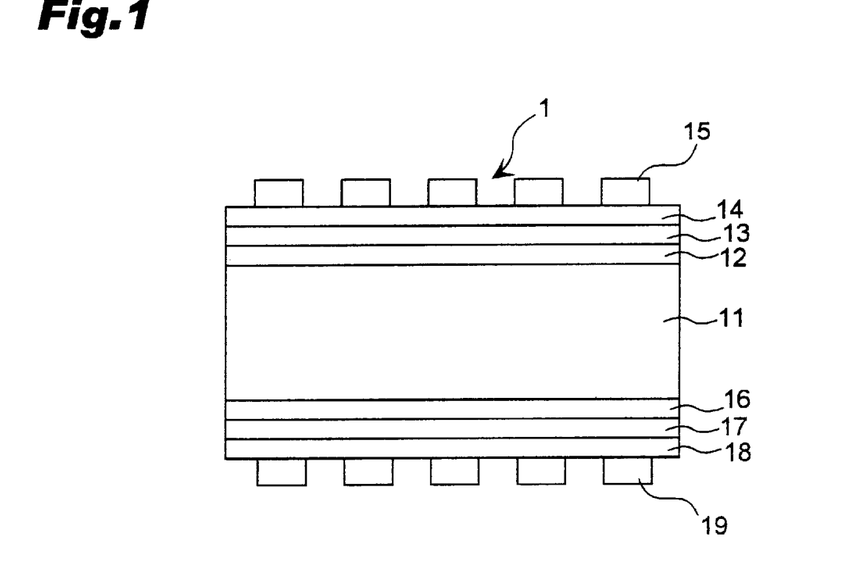
FIG. 1 is a cross sectional view of an element of a solar cell used in this invention.
Figure 2A:
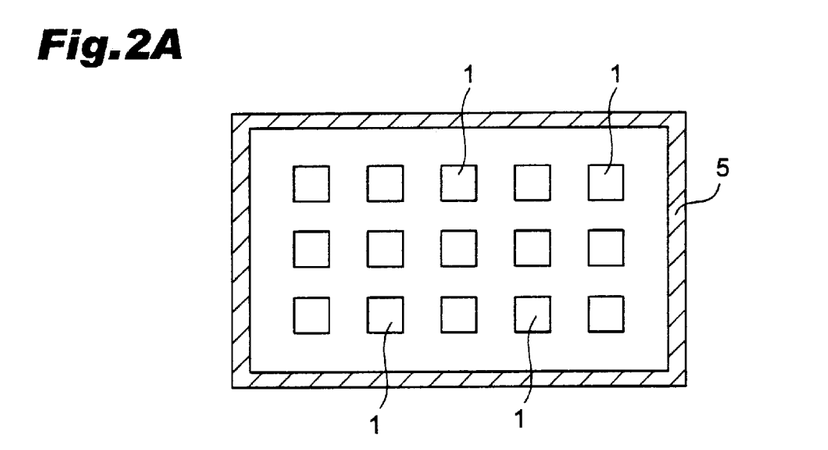
FIG. 2A is a plan view.
Figure 2B:
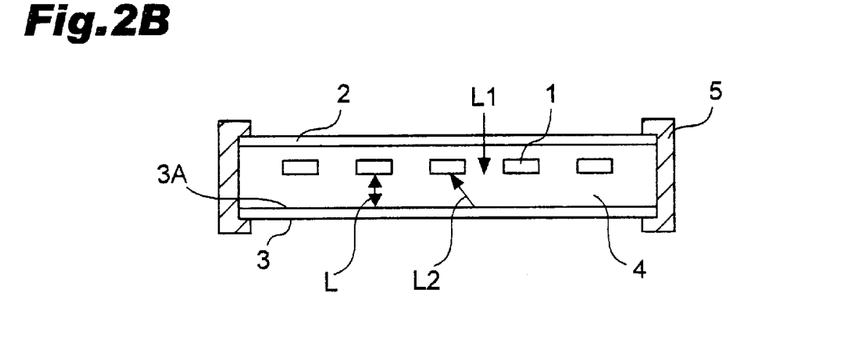
FIG. 2B is a cross sectional view.

Explanation is made on a solar cell module according to a first embodiment of the present invention by referring to FIGS. 1, 2. FIG. 1 is a cross sectional view of an element of a solar cell used in a solar cell module according to this embodiment. FIGS. 2A, 2B are schematic structural views of the solar cell module according to this embodiment. FIG. 2A is a plan view and FIG. 2B is a cross sectional view.

The solar cell module of this invention uses a two-side incidence type solar cell as a solar cell 1 capable of generating power by utilizing light incident from both front and rear surfaces. Explanation is made on one example of the two-side incidence type solar cell by referring to FIG. 1.

As shown in FIG. 1, the solar cell 1 comprises a substrate 11 of n-type conductive crystalline semiconductor of single crystalline silicon or polycrystalline silicon, a first intrinsic amorphous semiconductor layer 12 of approximately 100 Å formed on a light incident surface of the substrate 11, a p-type amorphous semiconductor layer. 13 of about 200 Å, and a first transparent conductive film 14 laminated in this order, and a first collector 15 for collecting current having a comb shape or the like formed on the first conductive film 14.

A second intrinsic amorphous semiconductor layer 16 of approximately 100 Å, an n-type amorphous semiconductor layer 17 of approximately 200 Å, and a second transparent conductive film 18 are laminated in this order on a light transmitting surface of the n-type substrate 11, and a second collector 19 for collecting current having a comb shape or the like is formed on the second conductive film 18.

The first amorphous semiconductor layer 12 and the second amorphous semiconductor layer 16 are formed from amorphous semiconductor material such as amorphous silicon, amorphous silicon carbide, and amorphous silicon germanium or the like. The p-type amorphous semiconductor layer 13 and the n-type amorphous semiconductor layer 17 may be formed from these amorphous semiconductor material. The first conductive film 14 and the second conductive film 18 are formed from transparent conductive oxide film such as tin oxide ($SnO_2$), indium tin oxide (ITO), and zinc oxide (ZnO) or the like.

Light incident from the front surface of the solar cell 1 of this structure enters the first conductive film 14 exposed from the first collector 15, and reaches to the substrate 11 through the first conductive film 14, the p-type amorphous semiconductor layer 13, and the first intrinsic amorphous semiconductor layer 12 to contribute to power generation.

Light incident from the rear surface enters the second conductive film 18 exposed from the second collector 19, and reaches to the substrate 11 through the second conductive film 18, the n-type amorphous semiconductor layer 17, and the second intrinsic amorphous semiconductor layer 16 to contribute to power generation.

The solar cell 1 of this structure generates power by utilizing light incident from both the front and rear surfaces. When photovoltaic characteristics of the front and rear surfaces of the solar cell irradiated with light of AM1.5, 100 $mW/cm^2$ are measured, the photovoltaic conversion efficiency in irradiating light from the rear surface is approximately 70% of the photovoltaic conversion efficiency in irradiating light from the front surface.

A structure of the two-side incidence type solar cell is not limited to the one shown in FIG. 1, but may be any of structures as long as power is generated by utilizing light incident from both of the front and rear surfaces. For example, a solar cell comprising only crystalline semiconductor material, only amorphous semiconductor material, or only compound semiconductor material may be used for the solar cell module of this invention as long as it generates power by utilizing light incident from both front and rear surfaces.

Explanation is made on the solar cell module using the two-side incidence type solar cell according to this embodiment.

As shown in FIGS. 2A, 2B, a plurality of the solar cells 1 comprise a transparent front surface member 2, a rear surface member 3, and a transparent sealing material 4 sealed therebetween. The solar cells 1 are electrically connected in series or in parallel each other with a conductive connecting member of copper foil, aluminum foil or the like (not shown), and an optional output can be taken out from the module.

As shown in FIG. 2A, the solar cell module according to this embodiment has a space between adjacent solar cells wider than a conventional one and can increase quantity of light incident to the rear surface member 3 through the space. In addition, as shown in FIG. 2B, a surface 3A of the rear surface member 3 corresponding to the solar cell 1 is light-reflective, and a distance L between the surface 3A and the solar cell 1 is larger as compared with the conventional one. Incident light L1 entering a space between the adjacent solar cells 1 from a side of the front surface member 2 is reflected on the surface 3A of the rear surface member 3, and incident light L2 reflected on the surface 3A is introduced to a rear surface of the solar cell 1.

Glass is suitable for the front surface member 2. Particularly a white plate reinforced glass having excellent light transmittivity and shock resistance is generally used. The rear surface member 3 comprises a metal film of aluminum or the like sandwiched between weather resistant resin films of PET (polyethylene terephthalate) or the like so as to be weather and moisture proof and electrically insulative. PVB (polyvinyl butyral) capable of suppressing degradation of light transmittivity caused by ultra violet rays and EVA (ethylene vinyl acetate) having excellent moisture proofness is mainly used as the sealing material 4.

A frame 5 of aluminum may be mounted around the module so as to improve the strength of the whole module.

In the solar cell module of this structure, incident light L1 incident between a space between the adjacent solar cells 1 from the front surface side is reflected on the surface 3A of the rear surface member 3, and reflected light L2 reflected on the surface 3A is incident to the rear surface of the solar cell 1. When the light quantity of reflected light L2 is approximately equal to the light quantity of the incident light L1, 70% of power generated when the incident light L1 is incident from the front surface side to the solar cell 1 is obtained. Therefore, this solar cell module according to this invention can increase power generated by the single solar cell 1 approximately 1.7 times as great as the module utilizing incident light in a conventional method since both of the incident light L1 and the reflected light L2 are incident to the solar cell 1. This invention can provide a solar cell module capable of reducing the number of necessary solar cells by approximately 1/1.7 of the conventional one for obtaining the same power as the conventional one and having excellent output characteristics at low cost.

As described above, the solar cell module according to this embodiment is so structured that the incident light L1 incident to the space between the adjacent solar cells 1 from the front surface side is reflected on the surface 3A of the rear surface member 3 and the reflected light L2 is introduced to the rear surface of the solar cell 1. Therefore, the quantity of power generated by the single solar cell 1 increase as compared with the conventional one. The number of solar cells 1 necessary for providing the same quantity of output as the conventional module can be reduced, and thus this invention can provide a solar cell module having excellent output characteristics at low cost.

Figure 3A:
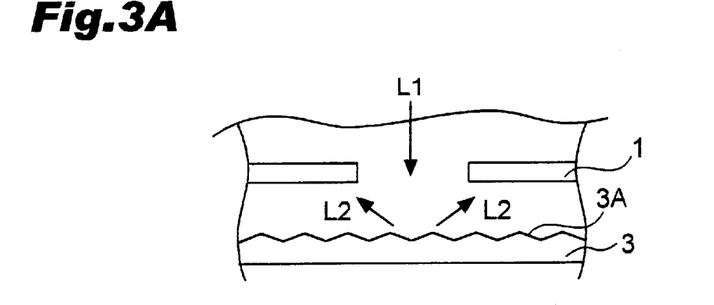
FIGS. 3A, 3B are partially enlarged cross sectional views of the solar cell module according to the first embodiment.

The surface 3A of the rear surface member 3 is preferred to have a scattering reflecting surface with many of projected and recessed parts as shown in the partially enlarged cross sectional view of FIG. 3A so that the incident light L1 incident to the space between the solar cells 1 from the front surface side is reflected on the surface 3A of the rear surface member 3 and is introduced to the rear surface of the solar cell 1 effectively irrespective of lapse of time. This scattering reflecting surface includes many of protruded and recessed part of a triangle shape in two-dimensional viewpoint. By using this structure, the incident light L1 is slantly reflected from the surface 3A, and the reflected light L2 is introduced to the rear surface of the solar cell 1 effectively even when an incident angle of sun light changes depending on time. Shapes of the protrusions and recessed parts on the scattering reflecting surface may be a triangle wave shape, a pyramid shape, and a reverse pyramid shape. The surface 3A having this scattering reflecting surface may be formed from metal material applied with mat finish, or resin material mixed with white pigment. This scattering reflecting surface may be provided at least in an area corresponding to the space between the solar cells, and is not necessarily formed on the whole surface 3A of the rear surface member 3.

Figure 3B:
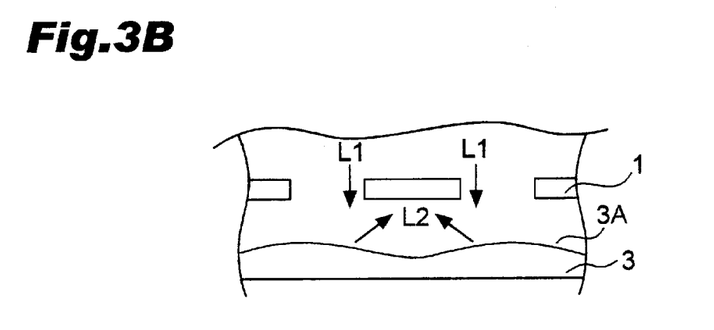

In other case, as shown in the partially enlarged cross sectional view of FIG. 3B, the surface 3A of the rear surface member 3 may be a reflecting surface having recessed parts corresponding to the solar cells 1. The recessed parts are formed as if many of bowls are turned down. The deepest parts of the recessed parts corresponds to an approximately center part of the solar cell, and their end parts are at an approximately center of the space between the adjacent solar cells. The surface 3A having the recessed parts may be formed from metal material and resin material mixed with white pigment.

In this embodiment, the surface 3A of the rear surface member 3 reflects the incident light. In other case, the incident light may be reflected between the solar cell 1 and the rear surface member 3 or on a rear surface of the rear surface member 3 which is made transparent so that the incident light may be reflected.

Figure 4A:
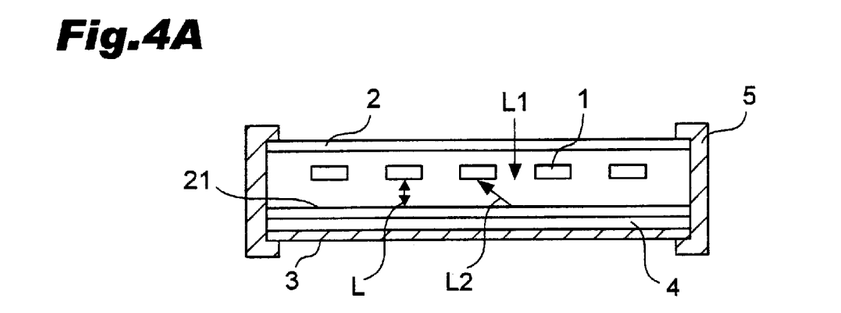
FIGS. 4A, 4B are structural cross sectional views of another solar cell module according to the first embodiment.
Figure 4B:
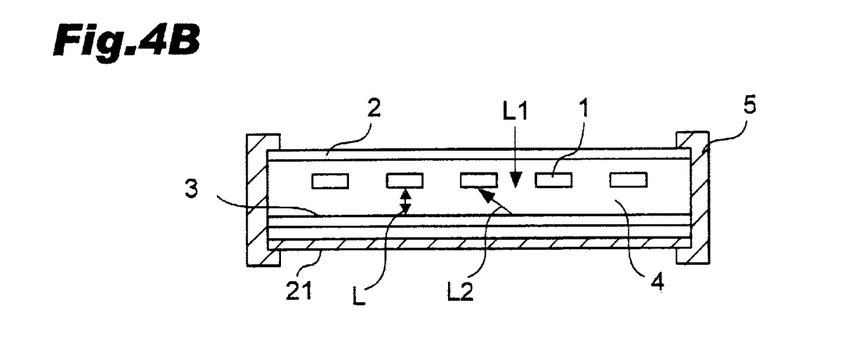

FIGS. 4A, 4B are structural cross sectional views illustrating another solar cell module according to the embodiment. The elements having the same functions as in the case of FIG. 1 have the same reference numerals. As shown in FIG. 4A, the reflective member 21 for reflecting the incident light L1 may be provided between the solar cell 1 and the rear surface member 3, or as shown in FIG. 4B, the reflective member 21 may be provided behind the rear surface member 3. When providing the reflective member 21 behind the rear surface member 3, the rear surface member 3 is necessary to be transparent.

When the solar cell module is so structured that a reflecting surface of the reflective member 21 is a scattering reflecting surface or a recessed surface corresponding to the solar cell 1 as shown in FIGS. 3A, 3B, the incident light L1 is reflected and the reflected light L2 is effectively introduced to the rear surface of the solar cell 1. Therefore, the quantity of power generated by the solar cell increases as compared with the conventional one, and the invention can reduce the number of solar cells necessary for obtaining the same output.

As described above, it is necessary to effectively introduce the light reflected on the rear surface side to a rear surface of the solar cell. In order to achieve this, a distance L between the rear surface of the solar cell 1 and the reflecting surface comprising the surface 3A of the rear surface member 3 or the reflecting surface of the reflective member 21 should be large at some degrees. For example, in the conventional solar cell module, a distance between the solar cell 1 and the rear surface member 3 is approximately 0.3 mm, and it is difficult to effectively introduce the light reflected on the reflecting surface in such a short distance and the most of the reflected light is emitted outside from the front surface member 2 through the space between the solar cells 1. Therefore, it is preferred that a distance L for effectively introducing the reflected light to the rear surface of the solar cell 1 is not less than 10 mm. When the distance L between the rear surface of the solar cell 1 and the reflecting surface is not less than 10 mm, the light reflected on the reflecting surface is effectively introduced to the rear surface of the solar cell 1 to contribute to power generation of the solar cell 1.

In addition, it is important to have a space between the adjacent solar cells 1 larger than the conventional one in this solar cell module.

Figure 5:
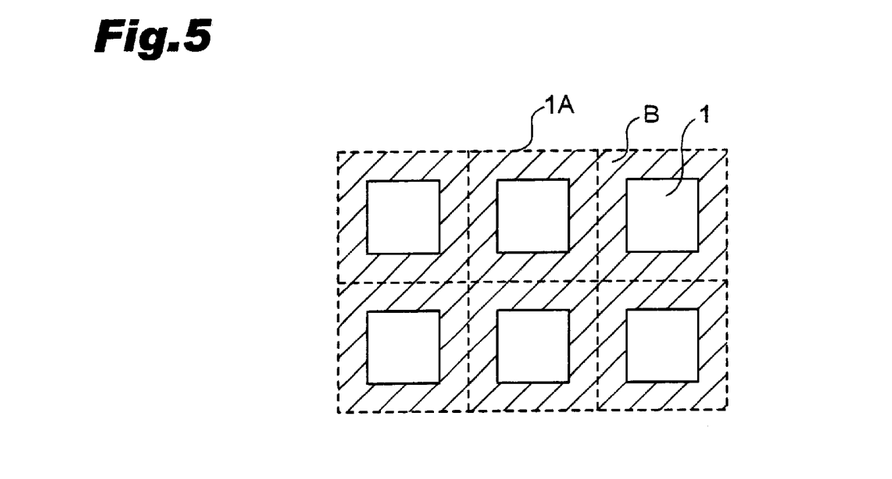
FIG. 5 is a schematic plan view illustrating a relation between an area of a solar cell and an area of a space.

When the solar cell 1 has an approximately square shape, as indicated with a broken line in the schematic plan view of FIG. 5, an area formed by isotropically enlarging the solar cell 1 around a center of the solar cell 1 and made contact with another area is called a virtual area 1A. Light incident from the front surface side to an area B excluding the solar cell 1 in the virtual area 1A (indicated with slant lines) is reflected on the rear surface side and is introduced to the rear surface of the solar cell. Therefore, when an area of the solar cell 1 is S1, an area of the area B is S2, and a ratio of reflected light reflected on the rear surface and introduced to the rear surface of the solar cell 1 out of the light incident to the area B is α, light quantity of incident light from the front surface side of the solar cell is in proportion to S1, and light quantity of incident light from the rear surface side of the solar cell is in proportion to α·S2.

When a ratio of the power generated when light is incident from the rear surface of the solar cell 1 to the power generated when light of same quantity is incident from the front surface of the solar cell is β, the power generated by the solar cell with light incident from the front surface side is in proportions to S1, and the power generated by the solar cell with light incident from the rear surface side is in proportion to α·β·S2.

Therefore when the solar cells having an approximately same area are arrayed with an equal space in a solar cell module, the power generation P1 by light incident from the front surface side on the whole module is in proportion to a total area of the solar cells, and the power generation P2 by light incident from the rear surface side is in proportion to α·β·(total area of the spaces). At that time, a relation (total area of the spaces)=(an area of the solar cell module)−(total area of the solar cells) is established and the above P2 can be expressed by a function of the total area of the solar cells.

Figure 6:
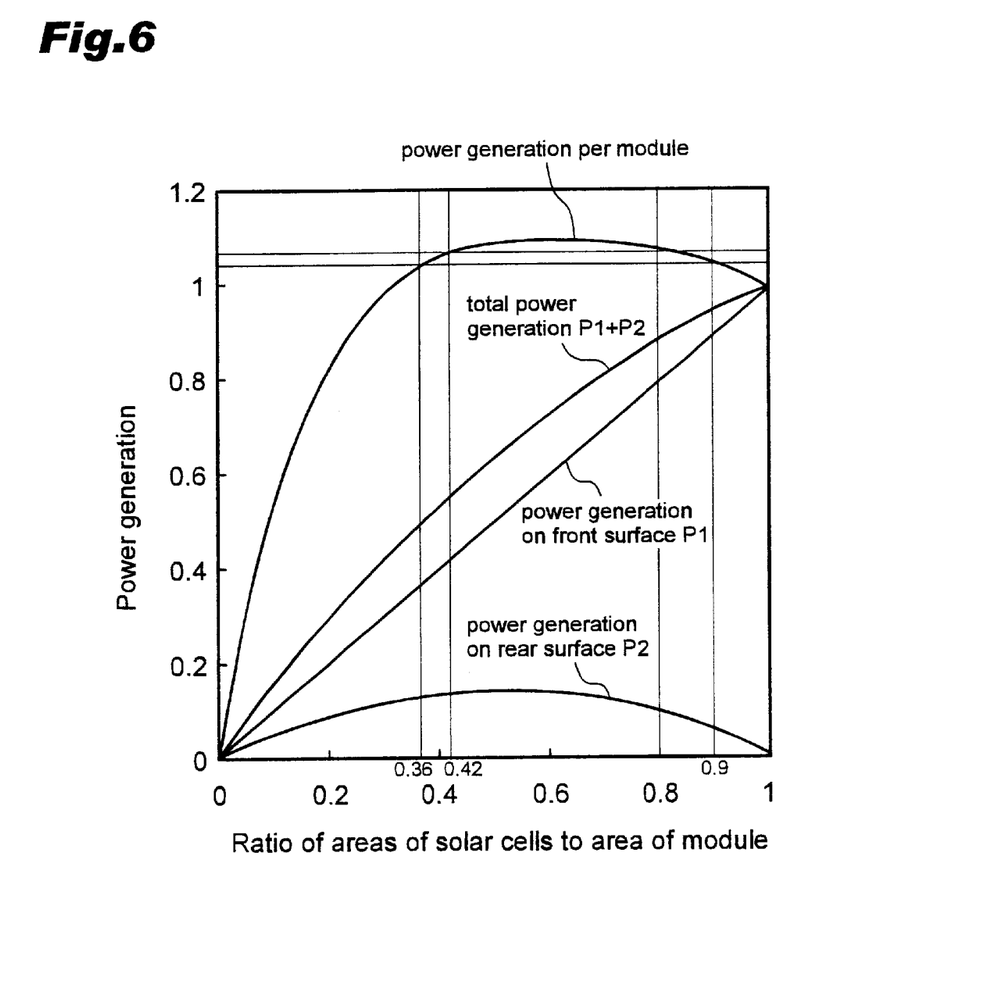
FIG. 6 is a characteristic diagram illustrating relation between a quantity of power generated by the solar cell module and a ratio of an area of the solar cell to an area of the solar cell module.

FIG. 6 is a characteristic diagram of relation between power generation and a ratio of areas of solar cells to a solar cell module. The x-axis is a ratio of areas of the solar cells to the solar cell module, and the y-axis is an amount of power generation. In this case, the value of β is assumed to be 0.7, and the value of α is assumed to be 0.8, which may depend on shapes of the reflective member.

Production cost is a sum of a fluctuating cost which is approximately in proportion to area of solar cells and a fixed cost which little depends on areas of solar cells and includes cost of the front surface member, the rear surface member, and the sealing material or the like. In comparing the solar cell modules having same areas, the cost for a solar cell module varies depending on the area of the solar cells to be used.

Cost of solar cells in production cost of a conventional module, in which the solar cells are arrayed with little space, accounts for approximately 80%, and fixed cost such as the front surface member, the rear surface member, and the sealing material etc. accounts for 20%. Therefore, a cost for the whole solar cell module is supposed to be in proportion to 0.2+0.8(ratio of the area of the solar cell). The amount of power generated per module calculated from this is illustrated in FIG. 6.

Power generation per module varies as shown in FIG. 6, and the ratio of the area of the solar cells to the whole solar cell module is set to be 0.36–0.9, more preferably 0.42–0.8 so that a solar cell module capable of generating greater power per module is provided. The optimum range, which will vary depending on a rate of a fluctuating cost and a fixed cost in a total cost for manufacturing a module, and the value of α·β, is set to be approximately 0.4–0.9, more preferably be approximately 0.4–0.8 so that a solar cell module capable of generating greater power per module is provided.

The above embodiment can provide a solar cell module capable of having excellent output characteristics at low cost.

Second Embodiment

Figure 7:
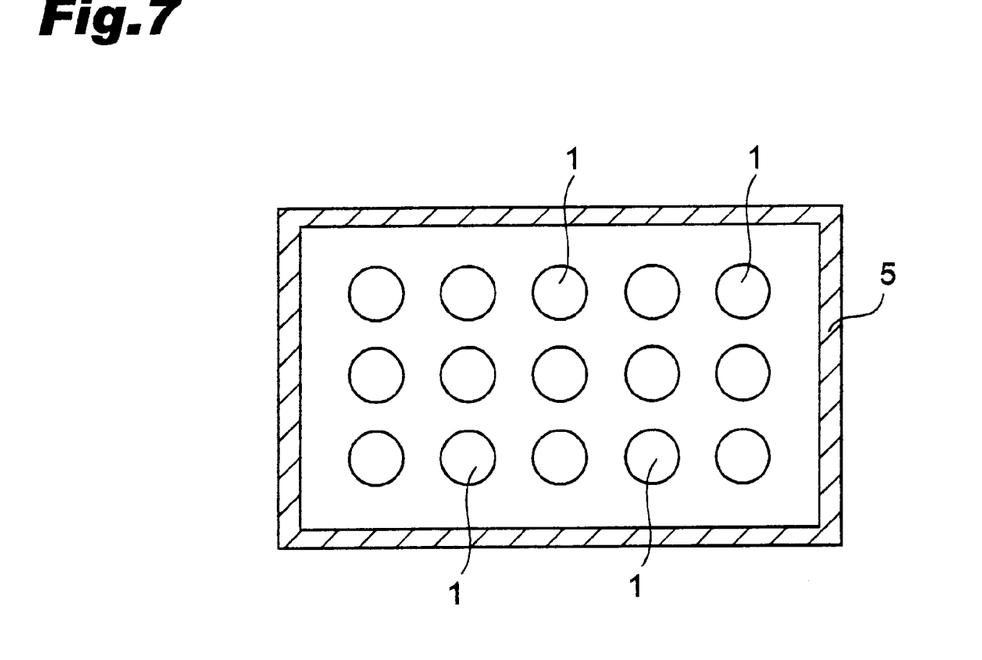
FIG. 7 is a schematic plan view illustrating a solar cell module according to a second embodiment.

A solar cell module according to a second embodiment of this invention is illustrated in a schematic plan view of FIG. 7. This embodiment is different from the first embodiment in that the solar cell 1 has an approximately circle shape, and the rest is the same as of the first embodiment.

When crystalline semiconductor substrate such as a single crystalline Si is used as a substrate for the solar cell, the crystalline semiconductor substrate of an approximately circle shape is supplied. Conventionally, an approximately square-shaped substrate is cut out from the approximately circle-shaped substrate for a substrate as a solar cell, and the rest part which is cut off is wasted. For example, a substrate of an approximately square shape with an approximately 10.4 cm of one side is cut off from an approximately circle shaped wafer of approximately 14 cm in diameter to use as a solar cell. In this case, approximately 70% of the original wafer is used as a solar cell and the rest 30% of the wafer is wasted.

In this embodiment, an approximately circle-shaped semiconductor wafer is used as a substrate and an approximately circle-shape solar cell is used. The solar cell module according to this embodiment effectively use semiconductor wafer which has not been used in vain conventionally. Therefore, a solar cell module of excellent output characteristics is provided at low cost.

A structure of a reflective member for reflecting light incident to a space between adjacent solar cells from a front surface side to a rear surface side, and a distance L between the reflective member and the rear surface of the solar cell are the same as in the first embodiment.

Regarding to an area of a space between adjacent solar cells 1, explanation is made as follows.

Figure 8:
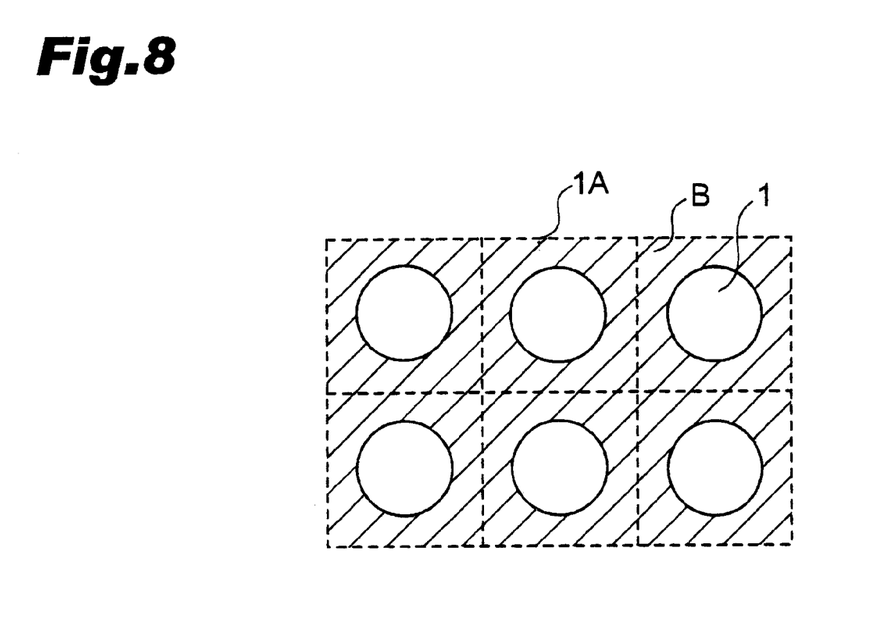
FIG. 8 is a schematic plan view illustrating relation between an area of a solar cell and an area of a space in the solar cell module according to the second embodiment.

As indicated with a broken line in a schematic plan view of FIG. 8, an area having a square shape around the solar cell 1 and being adjacent to another area is called as a virtual regions 1A, wherein the solar cell 1 has an approximately circle shape. In this case, light incident from the front surface side to an area B (indicated with slant lines) except the solar cell 1 in the virtual region 1A is reflected on the rear surface side and is introduced to the rear surface of the solar cell. Therefore, as described in the first embodiment, a ratio of the areas of solar cells to the area of the whole solar cell module is set to be approximately 0.4–0.9, more preferably approximately 0.4–0.8 to provide a solar cell module having greater power generation per module.

Figure 9A:
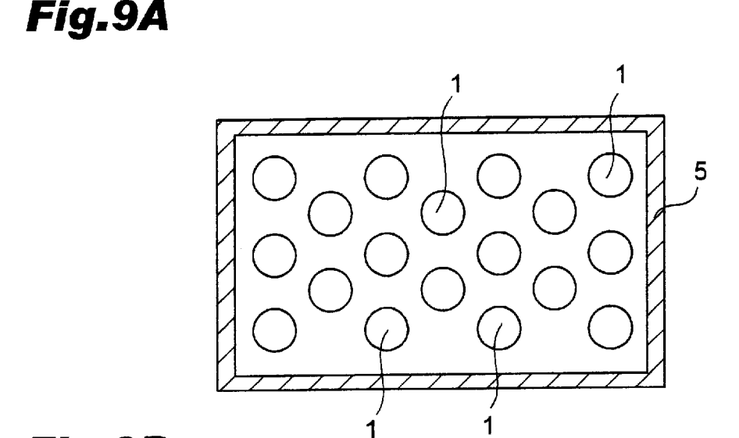
FIGS. 9A, 9B, 9C are schematic plan views illustrating another example of the solar cell module according to the invention.
Figure 9B:
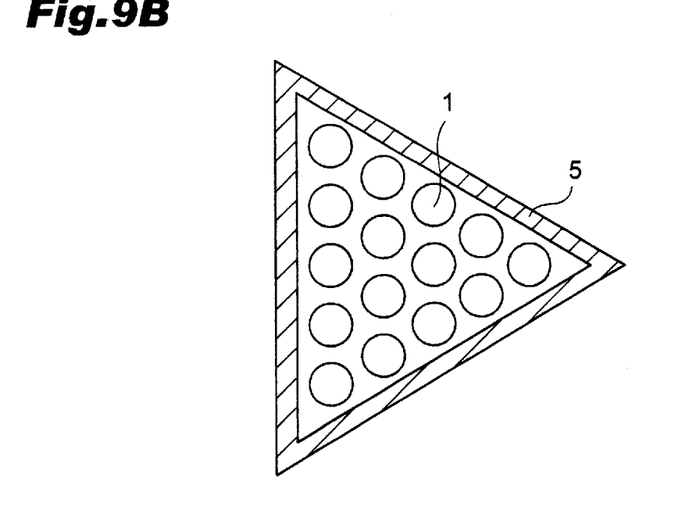
Figure 9C:
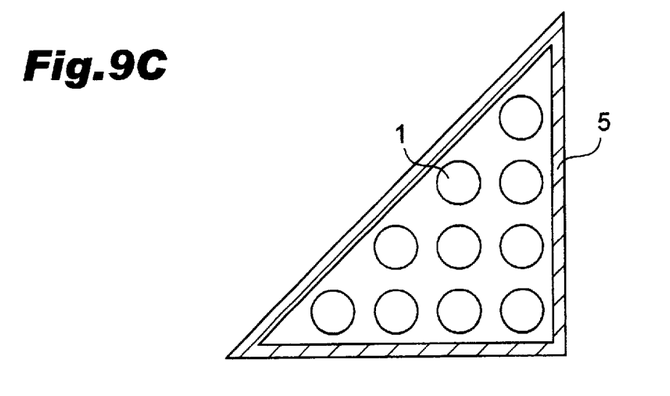

A shape of the solar cell module and arrangement of the solar cells are not limited to the above embodiment. For example, an arrangement of the solar cells may be the arrangement of FIG. 9A, and a shape of the solar cell module may be a triangle shape of FIGS. 9B, 9C as shown in the schematic plan views of FIGS. 9A–9C As described above, the solar cell module according to this embodiment uses the two-side incidence type solar cell. The incident light to the space between the adjacent solar cells from the front surface side is reflected on the rear surface, and the reflected light is introduced to the rear surface of the solar cell. Therefore, power generated by the solar cell increases as compared with a conventional one, and the number of solar cells necessary for providing output equal to the conventional one can be reduced. Thus the solar cell module of excellent output characteristics is provided at low cost.

The approximately circle-shaped solar cells result in lower cost of the solar cell itself without wasting semiconductor substrates, and a solar cell module of excellent output characteristic is provided at low cost.

Although the present invention has been described and illustrated in detail, it is clearly understood that the same is and example only and is not to be taken by way of limitation by way of illustration, the spirit and scope of the present invention being limited only by the terms of the appended claims.

What is claimed is:

1. A solar cell module comprising:
   a crystalline semiconductor substrate;
   a front surface member which is transparent;
   a rear surface member,
   a plurality of two-side incidence solar cells arranged between the front surface member and the rear surface member,
   a connecting member which is conductive for electrically connecting the solar cells in series or in parallel, and
   a reflecting surface for reflecting light, wherein the light is incident from the front surface member to a space between the solar cells which are adjacent to each other, and for introducing the reflected light to a rear surface of the solar cells.

2. The solar cell module according to claim 1, wherein a ratio of the areas of the solar cells to the area of the solar cell module is approximately 0.4–0.9.

3. The solar cell module according to claim 1, wherein the solar cells have an approximately circular shape.

4. The solar cell module according to claim 1, wherein the reflecting surface is a scattering reflecting surface and is provided at least in a position corresponding to the space.

5. The solar cell module according to claim 1, wherein the reflecting surface is formed to be a recessed surface corresponding to the solar cells.

6. The solar cell module according to claim 1, wherein the reflecting surface is provided on a front surface of the rear surface member.

7. The solar cell module according to claim 1, wherein the reflecting surface is provided between the rear surface member and a rear surface of the solar cells.

8. The solar cell module according to claim 1, wherein the rear surface member is formed of transparent material, and the reflecting surface is provided on a rear surface of the rear surface member.

* * * * *